US008390390B2

(12) United States Patent
Ito et al.

(10) Patent No.: US 8,390,390 B2
(45) Date of Patent: Mar. 5, 2013

(54) OVEN CONTROLLED CRYSTAL OSCILLATOR

(75) Inventors: Manabu Ito, Saitama (JP); Hiroyuki Mitome, Saitama (JP); Takeo Oita, Saitma (JP)

(73) Assignee: Nihon Dempa Kogyo Co., Ltd., Shibuya-Ku (JP)

( * ) Notice: Subject to any disclaimer, the term of this patent is extended or adjusted under 35 U.S.C. 154(b) by 195 days.

(21) Appl. No.: 12/924,252

(22) Filed: Sep. 23, 2010

(65) Prior Publication Data

US 2012/0161887 A1 Jun. 28, 2012

(30) Foreign Application Priority Data

Oct. 1, 2009 (JP) ................................ 2009-229173

(51) Int. Cl.
*H03B 5/32* (2006.01)

(52) U.S. Cl. ....... 331/158; 331/176; 331/66; 331/116 R; 331/116 FE

(58) Field of Classification Search .................. 331/176, 331/158, 116 R, 66, 116 FE
See application file for complete search history.

(56) References Cited

U.S. PATENT DOCUMENTS

| | | | | |
|---|---|---|---|---|
| 5,703,542 | A | 12/1997 | Blandino | |
| 7,345,552 | B2 * | 3/2008 | Ito et al. | 331/69 |
| 7,479,835 | B2 * | 1/2009 | Mitome et al. | 331/69 |
| 7,737,796 | B2 * | 6/2010 | Ito et al. | 331/70 |

FOREIGN PATENT DOCUMENTS

| | | |
|---|---|---|
| JP | 2002175703 | 10/2002 |
| JP | 2002314339 A | 10/2002 |
| JP | 2005175703 A | 6/2005 |
| JP | 2005314339 | 6/2005 |
| JP | 2005-333315 | 12/2005 |
| JP | 2007110698 A | 4/2007 |

* cited by examiner

*Primary Examiner* — Arnold Kinkead
(74) *Attorney, Agent, or Firm* — Edwards Wildman Palmer LLP; Scott D. Wofsy; Christopher J. Capelli

(57) ABSTRACT

The present invention relates to an oven controlled crystal oscillator that can obtain stable oscillation frequency by reducing a temperature change in an oscillation element. The oven controlled crystal oscillator comprises; a heat-conducting plate mounted on one surface of a circuit board, a crystal resonator mounted on a surface of the heat-conducting plate opposite to the surface of the circuit board, an oscillation element constituting an oscillation circuit together with the crystal resonator, and a thermistor that detects temperature of the crystal resonator, a heating resistance which heats the crystal resonator, and a temperature control element including at least a power transistor, to constitute a temperature control circuit together with the thermistor and the heating resistance. In the oven controlled crystal oscillator, two or more open areas communicating with the heat-conducting plate at least in the thickness direction thereof are formed on the periphery of the heat-conducting plate at positions point-symmetric with respect to the crystal resonator, and one or more of each of the power transistor and the heating resistance are arranged in the same number in all of the open areas.

13 Claims, 4 Drawing Sheets

OVEN CONTROLLED CRYSTAL OSCILLATOR

TECHNICAL FIELD

The present invention relates to an oven controlled crystal oscillator using a crystal resonator (hereinafter, referred to as an "oven controlled crystal oscillator"), and more specifically, relates to an oven controlled crystal oscillator that suppresses a temperature change in a crystal resonator and an oscillation element constituting an oscillation circuit.

BACKGROUND ART

1. Background of the Invention

In an oven controlled crystal oscillator, in particular because an operation temperature of the crystal resonator can be kept constant, a highly stable oscillation frequency of an order of, for example, 0.1 ppm or less or 1 ppb can be obtained without causing frequency change dependent on a frequency-temperature characteristics. These oven controlled crystal oscillators are used particularly as fixed stations in communication equipment.

2. Prior Art

FIG. 4 is a diagram for explaining an oven controlled crystal oscillator in a conventional example described in Patent Document 1, wherein FIG. 4A is a sectional view of the oven controlled crystal oscillator, and FIG. 4B is a plan view of a circuit board as seen from the direction A in FIG. 4A. FIG. 4A is a sectional view on arrow IV-IV in FIG. 4B.

As shown in FIG. 4, an oven controlled crystal oscillator 1 is configured by enclosing and sealing a circuit board 2 having an oscillation circuit and a temperature control circuit formed thereon, in a container comprising a metal base 3 and a metal cover 4. On the circuit board 2 is mounted a heat-conducting plate 6 on which is mounted a crystal resonator 5, an oscillation element 7 constituting an oscillation circuit together with the crystal resonator 5, a thermistor 8 serving as a temperature sensor that detects the temperature of the crystal resonator 5, a heating resistance 9 that heats the crystal resonator 5 depending on the temperature detected by the thermistor 8, and a temperature control element 10 comprising a power transistor 10*a* and the like constituting the temperature control circuit. Hereunder is a details description.

The oven controlled crystal oscillator 1 includes the circuit board 2 made from a glass epoxy material provided with a wiring pattern (not shown in the drawing). As shown in FIG. 4B, the rectangular heat-conducting plate 6 made of aluminum is mounted on one surface of the circuit board 2. The heat-conducting plate 6 is screw attached to the circuit board 2 by threading screws 11 at the four corners thereof. On the four side faces of the heat-conducting plate 6 there are formed open areas 12*a* to 12*d* opened on the four side faces and passing through in a thickness direction of the heat-conducting plate 6. Moreover a central through hole 13 is formed in the center of the heat-conducting plate 6.

The crystal resonator 5 with lead wires (oscillator lead wires 14) extending from an external bottom face (upward in FIG. 4A) is mounted on the surface of the heat-conducting plate 6 opposite to the surface facing the circuit board 2. The crystal resonator 5 has an SC-cut crystal piece (not shown in the drawing) housed thereinside, and the crystal piece is electrically connected to the oscillator lead wires 14. The oscillator lead wires 14 are inserted into through holes formed on the heat-conducting plate 6 to be joined to the circuit board 2, and are electrically connected to the oscillation element 7 constituting the oscillation circuit mounted on the circuit board 2. Here the oscillation element 7 includes, other than the oscillation circuit (for example, a Colpitts-type essential element), a capacitor, an inductor, a transistor as a buffer amplifying circuit, and the like according to application.

Moreover, the temperature control circuit for maintaining temperature of the crystal resonator 5 constant, is formed on the circuit board 2. The temperature control circuit includes the thermistor 8 as a temperature sensor that detects the temperature of the crystal resonator 5, the heating resistance 9 that heats the crystal resonator 5 depending on the temperature detected by the thermistor 8, and the temperature control element 10 comprising the power transistor 10*a* and the like.

The thermistor 8 is arranged inside the central through hole 13 of the heat-conducting plate 6. Moreover a chip resistance is used as the heating resistance 9, and is arranged inside the open areas 12*b* and 12*d*. Furthermore the power transistor 10*a* is arranged inside the open areas 12*a* and 12*c*. An amount of heat discharged by the power transistor 10*a* together with the heating resistance 9 is used for heating the crystal resonator 5.

Slits 15 are provided around the four corners of the heat-conducting plate 6 provided on the circuit board 2, thereby preventing an amount of heat generation of the heating resistance 9 and the power transistor 10*a* from escaping to the outside from the heat-conducting plate 6, so as to efficiently heat the crystal resonator 5. Such a circuit board 2 is enclosed and sealed inside the container comprising of the metal base 3 and the metal cover 4.

The metal base 3 is a flat plate in a plan view, and lead wires (oscillator lead wires 16*a* to 16*d*) penetrating the metal base 3 are provided at the four corners thereof serving as connecting terminals of the oven controlled crystal oscillator 1 (airtight terminals serving as the lead wires). The oscillator lead wire 16*a* which is the earth, is connected to the metal base 3 using silver solder 17, and the oscillator lead wires 16*b* to 16*d* other than the earth, which are supply terminals, output terminals, or the like, are insulated and connected inside through holes 18*a* of the metal base 3 by using glass 18.

The circuit board 2 is held by the oscillator lead wires 16*a* to 16*d*, and is arranged above the metal base 3. The oscillator lead wires 16*a* to 16*d* are electrically connected to the oscillation element 7 and the temperature control device 10 on the circuit board 2. Moreover the metal cover 4 is connected to the metal base 3 by resistance-welding, and the circuit board 2 is enclosed and sealed in the metal cover 4.

In such a conventional example, when the ambient temperature of the oven controlled crystal oscillator 1 changes to change the temperature of the crystal resonator 5, the thermistor 8 detects the temperature change of the crystal resonator 5, and the amount of heat generation of the heating resistance 9 is adjusted by the temperature control circuit. As a result the temperature of the crystal resonator 5 is kept constant (for example, about 85° C.). Accordingly, a change in the oscillation frequency can be suppressed.

[Patent Document 1] Japanese Unexamined Patent Publication No. 2005-333315

SUMMARY OF THE INVENTION

Problems to be Solved by the Invention (Problems in the Prior Art)

However, if the characteristics of power consumption at the time of change of the ambient temperature of the conventional oven controlled crystal oscillator 1 mentioned above (hereinafter, referred to as "power consumption characteristic") are examined, the heating resistance 9 (chip resistance) and the power transistor 10*a* show different power consumption characteristics. FIG. 5 shows a simple overview of a measurement result of the power consumption characteristics performed by the present inventor. Here the amount of heat generation of the heating resistance 9 and the power transistor 10*a* becomes the amount of heat generation corresponding to the power consumption, and when the ambient temperature becomes equal to or lower than 85° C., being a reference temperature of a constant-temperature bath, the power consumption of the heating resistance 9 increases and the amount of heat generation increases. On the other hand, in the power transistor 10*a*, when the ambient temperature is about 25° C., the power consumption becomes the largest to maximize the amount of heat generation, and the power consumption decreases before and after this.

FIG. 5 shows the situation where the power consumption of the heating resistance (chip resistance) 9 is larger on the low temperature side, and the power consumption of the power transistor 10*a* is larger on the high temperature side. Moreover as shown in FIG. 4B in the conventional example, because the heating resistance 9 and the power transistor 10*a* are arranged in different open areas 12, they are away from each other. Consequently, the temperature near the heating resistance 9 becomes higher than the temperature near the power transistor 10*a* on the low temperature side, and the temperature near the power transistor 10*a* becomes higher than the temperature near the heating resistance 9 on the high temperature side. In short, the overall temperature distribution on the circuit board becomes uneven.

In this case, for example, when there is a sharp external temperature change or when the wind blows from outside, the temperature distribution on the circuit board 2 is also affected. Therefore, in the case where the original temperature distribution is uneven as described above, an even more complicated temperature distribution occurs beyond prediction. Consequently, if power is supplied based on the temperature detected by the thermistor 8 arranged close to the crystal resonator 5, even if the operation temperature of the crystal resonator can be controlled within a specific temperature range, temperature control of the respective oscillation elements arranged in the periphery thereof becomes difficult.

Moreover, the respective oscillation elements 7 have temperature characteristics where the characteristics change more or less depending on the temperature. Consequently, control of the operation temperature of the respective oscillation elements 7 becomes difficult. Therefore, for example, there is a problem in that the stability of the oscillation frequency, for which an order of ppb is required, is impaired.

(Object of the Invention)

An object of the present invention is to provide an oven controlled crystal oscillator that can obtain stable oscillation frequency by reducing a temperature change in the oscillation element.

Means to Solve the Problems

The present invention provides an oven controlled crystal oscillator comprising: a heat-conducting plate mounted on a circuit board; a crystal resonator mounted on a surface of the heat-conducting plate opposite to the circuit board; an oscillation element constituting an oscillation circuit together with the crystal resonator, and a temperature sensor that detects temperature of the crystal resonator, mounted on the circuit board; a heating resistance mounted on the circuit board, which heats the crystal resonator depending on a temperature detected by the temperature sensor; and a temperature control element including at least a power transistor, mounted on the circuit board to constitute a temperature control circuit together with the temperature sensor and the heating resistance. In the oven controlled crystal oscillator of the present invention, two or more open areas communicating with the heat-conducting plate at least in the thickness direction thereof are formed on the periphery of the heat-conducting plate at positions point-symmetric with respect to the crystal resonator, and at least one of each of the power transistor and the heating resistance are arranged in the same number in all of the open areas.

Effects of the Invention

According to such a configuration, the same number of power transistors and heating resistances are arranged at least one each in all of the open areas. Therefore, power consumption differences are cancelled out so that the power consumption characteristics become identical, as seen in units of open area. Moreover, two or more open areas are formed on the periphery of the heat-conducting plate at positions point-symmetric with respect to the crystal resonator. Therefore, when power based on the detection temperature by the temperature sensor arranged close to the crystal resonator, is supplied to the power transistor and the heating resistance, the operation temperature of the crystal resonator is controlled within a specified temperature range, and the temperatures of oscillation elements arranged on the periphery of the crystal resonator are also controlled. That is, the temperature distribution on the circuit board is equalized.

In the case where there is a sharp external temperature change, or the wind blows from outside onto the crystal oscillator, the temperature distribution on the circuit board is also affected. However, as described above, in the oven controlled crystal oscillator according to the present invention, the temperature distribution on the circuit board can be equalized. Therefore, these influences become uniform, and temperature control of the respective oscillation elements is not difficult. Consequently, for example, a situation where the stability of the oscillation frequency, for which an order of ppb is required, is impaired, can be avoided.

(Embodiments)

In the present invention, the open areas are opened to the side faces of the heat-conducting plate. As a result, even if the heat-conducting plate is miniaturized with miniaturizing of the oven controlled crystal oscillator, it is still possible to form the open areas.

In the present invention, the heat-conducting plate has a rectangular shape as seen in a plan view, and the open areas are formed in the center of the four side faces in the heat-conducting plate. Moreover in the present invention, the heat-conducting plate has the rectangular shape, and the open areas are formed at four corners of the heat-conducting plate.

In the present invention, the construction is such that the inner side faces of the open areas are blocked. As a result, the majority of the amount of heat discharged by the power transistor and the heating resistance arranged in the open areas is transmitted to the heat-conducting plate, thereby enabling efficient heating of the crystal resonator.

In the present invention, the configuration is such that the heat-conducting plate is screw attached to the circuit board at the four corners thereof. In the present invention, the configuration is such that the heat-conducting plate is screw attached to the circuit board at the center of the four sides.

As a result, heat discharged by the power transistor and the heating resistance reaches the surface of the circuit board opposite to the surface facing the heat-conducting plate, via the heat-conducting plate and screws. Therefore, as well as the power transistor and the heating resistance, an area surrounded by the screws on the opposite surface is also heated by the screws. Hence the area is heated substantially from the whole circumference thereof. Consequently, in the area surrounded by the screws, temperature distribution is further equalized, and the temperature of the oscillation elements arranged in the area surrounded by the screws is also maintained uniform, thereby enabling to obtain stable oscillation frequency.

BRIEF DESCRIPTION OF THE DRAWINGS

FIG. 1 is a diagram for explaining a first embodiment of the present invention, wherein

FIG. 4 is a diagram for explaining a conventional example, wherein

BEST MODE FOR CARRYING OUT THE INVENTION (First Embodiment)

Figure 1A:
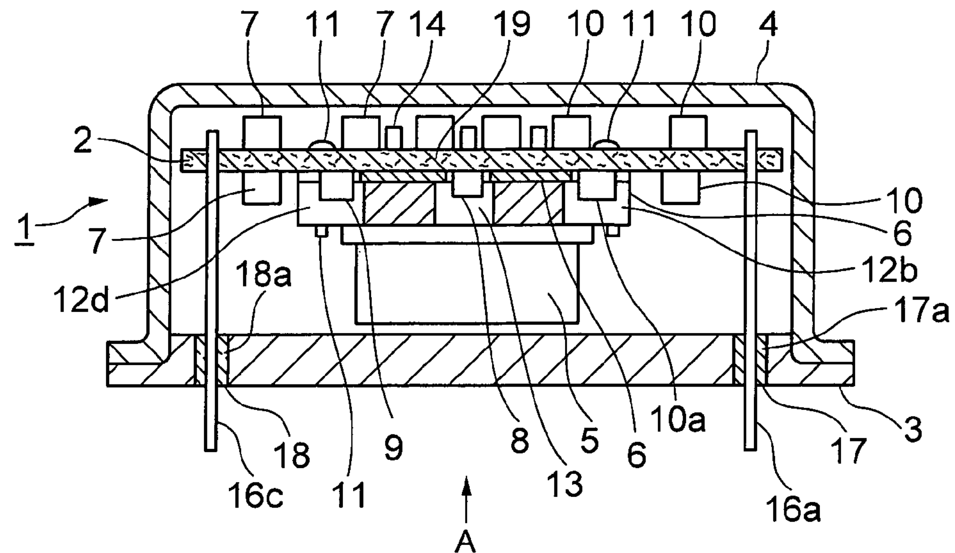
FIG. 1A is a sectional view of an oven controlled crystal oscillator.
Figure 1B:
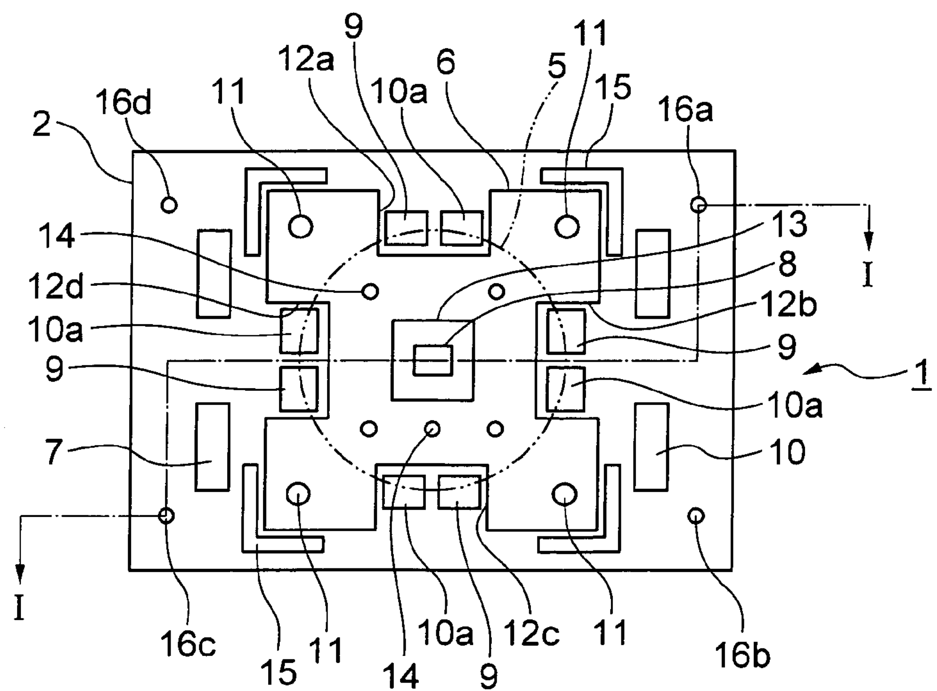
FIG. 1B is a plan view of a circuit board as seen from direction A shown in FIG. 1A.

FIG. 1 is a diagram for explaining a first embodiment of the present invention, wherein FIG. 1A is a sectional view of an oven controlled crystal oscillator, and FIG. 1B is a plan view of a circuit board as seen from direction A shown in FIG. 1A. FIG. 1A is a sectional view on arrow I-I in FIG. 1B. Here parts the same as in the conventional example are denoted by the same reference symbols, and explanation thereof is simplified or omitted.

As shown in FIG. 1A and FIG. 1B, an oven controlled crystal oscillator 1 in the first embodiment is configured by enclosing and sealing a circuit board 2 having an oscillation circuit and a temperature control circuit formed thereon, in a container comprising a metal base 3 and a metal cover 4 as in the conventional example. On the circuit board 2 is mounted a heat-conducting plate 6 on which is mounted a crystal resonator 5, an oscillation element 7 constituting the oscillation circuit together with the crystal resonator 5, a thermistor 8 serving as a temperature sensor that detects temperature of the crystal resonator 5, a heating resistance 9 that heats the crystal resonator 5 depending on the temperature detected by the thermistor 8, and a temperature control element 10 comprising a power transistor 10*a* and the like constituting the temperature control circuit.

Moreover, in the first embodiment, a heat radiation sheet 19 made from a silicone sheet having high heat conductivity, is arranged between the heat-conducting plate 6 and the circuit board 2. The purpose of the heat radiation sheet 19 is for increasing the heat conductivity by closely attaching the heat-conducting plate 6 and the circuit board 2 to each other, and functioning as an electrical insulating material. However, an area of the radiation sheet 19 where the thermistor 8, the heating resistance 9, and the power transistor 10*a* are mounted, is removed so as to conform to the shapes and sizes thereof, so that the thermistor 8 and the like can be soldered to the circuit board 2. Moreover, open areas 12*a* to 12*d* are formed on four side faces of the heat-conducting plate 6. Furthermore, the power transistor 10*a* and the heating resistance 9 are, respectively, arranged one each in the open areas 12*a* to 12*d*.

According to such a configuration, the power transistor 10*a* and the heating resistance 9 are respectively arranged one each in all the open areas 12*a* to 12*d*. Therefore the power consumption characteristics are the same in each of the open areas 12*a* to 12*d*. Furthermore, the open areas 12*a* to 12*d* are arrange at positions point-symmetric with respect to the crystal resonator 5.

Therefore, by supplying power based on a detection temperature detected by the thermistor 8 arranged close to the crystal resonator 5, to the power transistor 10*a* and the heating resistance 9, an operation temperature of the crystal resonator 5 is controlled within a specified temperature, and the temperature of the respective oscillation elements 7 arranged around the crystal resonator 5 is also controlled. That is, temperature distribution on the circuit board 2 is equalized.

Moreover, when there is a sharp external temperature change or when the wind blows from outside, the temperature distribution on the circuit board 2 is also affected.

However, as described above, in the oven controlled crystal oscillator of the present invention, the temperature distribution on the circuit board 2 can be equalized. Therefore, an influence of sharp temperature change or the like also becomes constant, and hence, temperature control of the respective oscillation elements is not difficult. Consequently, for example, a situation where the stability of the oscillation frequency, for which an order of ppb is required, is impaired, can be avoided.

Furthermore, in the oven controlled crystal oscillator of the present invention, slits 15 are formed in the circuit board 2 so as to surround the power transistor 10*a* and the heating resistance 9 so that heat transfer is blocked by the slits 15. Therefore, areas surrounded by the slits 15 are unlikely to be influenced by the ambient temperature of the oven controlled crystal oscillator 1. Consequently, the areas have particularly high uniformity of temperature distribution, and the stability of the oscillation frequency can be further increased by arranging the oscillation elements 7 which have a large influence on the oscillation frequency, in these areas.

Moreover, the open areas 12*a* to 12*d* are formed on the four side faces of the heat-conducting plate 6. Therefore, even if the heat-conducting plate 6 is miniaturized with miniaturization of the oven controlled crystal oscillator 1, it is still possible to form the open areas 12*a* to 12*d*.

Furthermore, as in the conventional example, the heat-conducting plate 6 is screw attached to the circuit board 2 at the four corners thereof. Therefore, heat discharged by the power transistor 10*a* and the heating resistance 9 reaches the surface of the circuit board 2 opposite to the surface facing the heat-conducting plate 6, via the heat-conducting plate 6 and the screws 11. Accordingly, as well as the power transistor 10*a* and the heating resistance 9, an area surrounded by the screws 11 on the opposite surface is also heated by the screws 11. Hence the area is heated substantially from the whole circumference thereof. Consequently, in the area surrounded by the screws 11, temperature distribution is further equalized, and the temperature of the oscillation elements 7 arranged in the area is also maintained uniform, thereby enabling to obtain stable oscillation frequency.

Moreover, the heat radiation sheet 19 is arranged between the heat-conducting plate 6 and the circuit board 2. Therefore a gap on a contact surface between the heat-conducting plate 6 and the circuit board 2 is filled so they are closely attached to each other. Consequently, heat of the heat-conducting plate 6 is evenly transferred to the circuit board 2, and the temperature of the oscillation elements 7 is maintained constant, thereby enabling to obtain a stable oscillation frequency.

(Second Embodiment)

Figure 2:
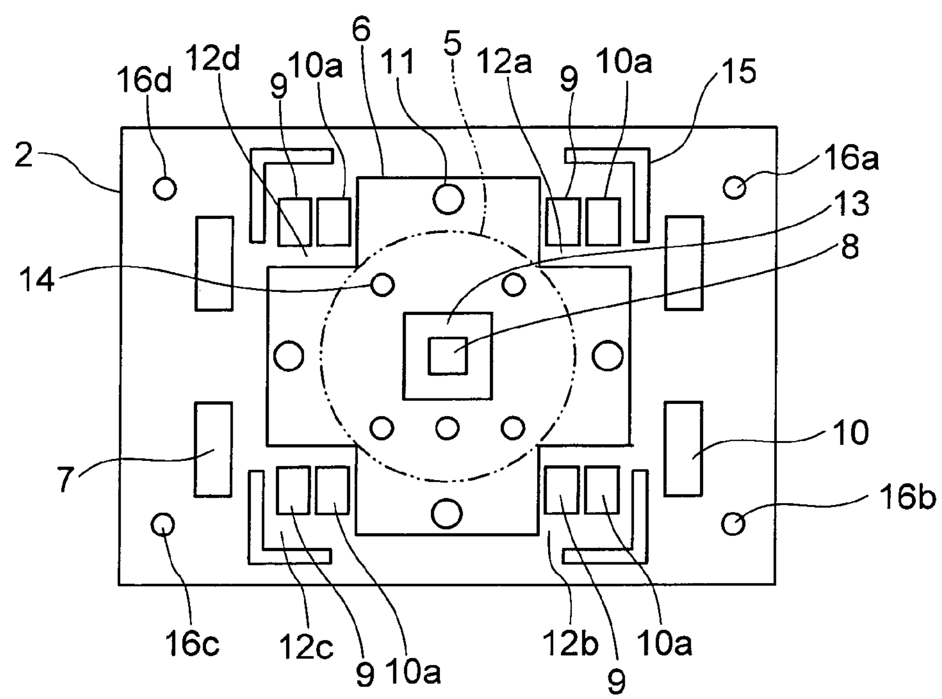
FIG. 2 is a plan view of a circuit board in a second embodiment of the present invention.

FIG. 2 is a plan view of a circuit board for explaining a second embodiment of the present invention. Parts the same as in the above embodiment are denoted by the same reference symbols, and explanation thereof is simplified or omitted.

The different points between the oven controlled crystal oscillator 1 in this embodiment and the oven controlled crystal oscillator 1 of the first embodiment are the arrangement of open areas 12*a* to 12*d*, and the screw attachment positions of the heat-conducting plate 6. That is, in the oven controlled crystal oscillator 1 in the second embodiment, the open areas 12*a* to 12*d* are formed at four corners of the heat-conducting plate 6, and a power transistor 10*a* and a heating resistance 9 are respectively arranged one each in the open areas 12*a* to 12*d*. Moreover, the heat-conducting plate 6 is screw attached to the circuit board 2 in a central part of the four sides of the heat-conducting plate 6. By such a configuration, the temperature of the oscillation elements 7 is maintained constant, and a stable oscillation frequency can be obtained as in the first embodiment.

(Third Embodiment)

Figure 3:
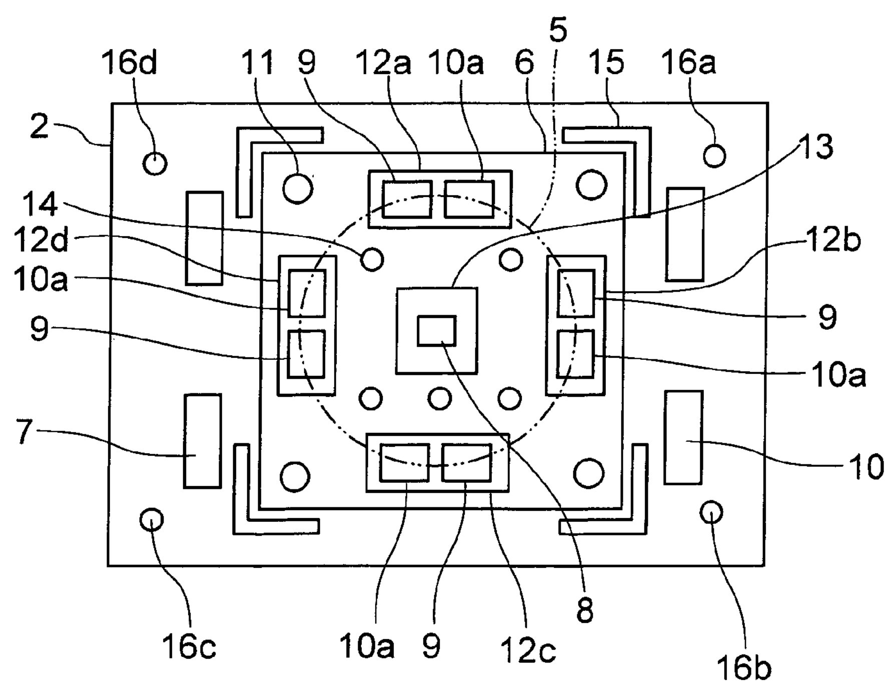
FIG. 3 is a plan view of a circuit board in a third embodiment of the present invention.
Figure 4A:
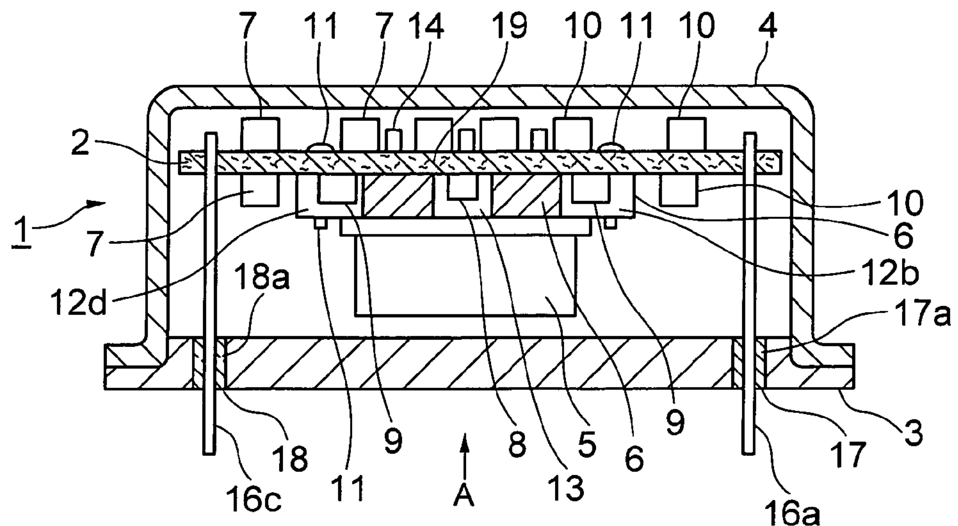
FIG. 4A is a sectional view of an oven controlled crystal oscillator.
Figure 4B:
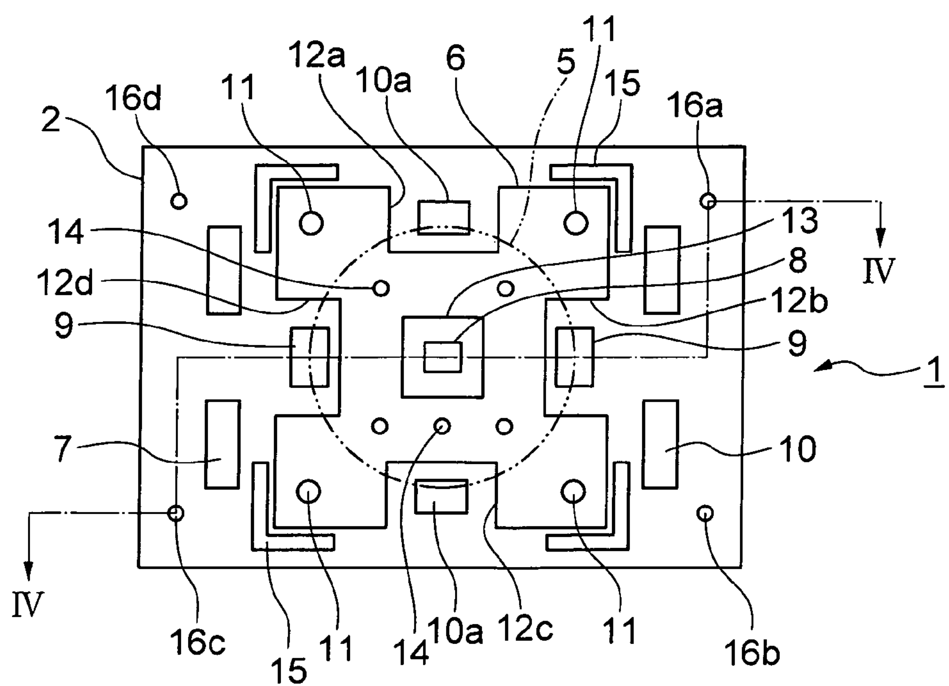
FIG. 4B is a plan view of a circuit board as seen from direction A shown in FIG. 4A.
Figure 5:
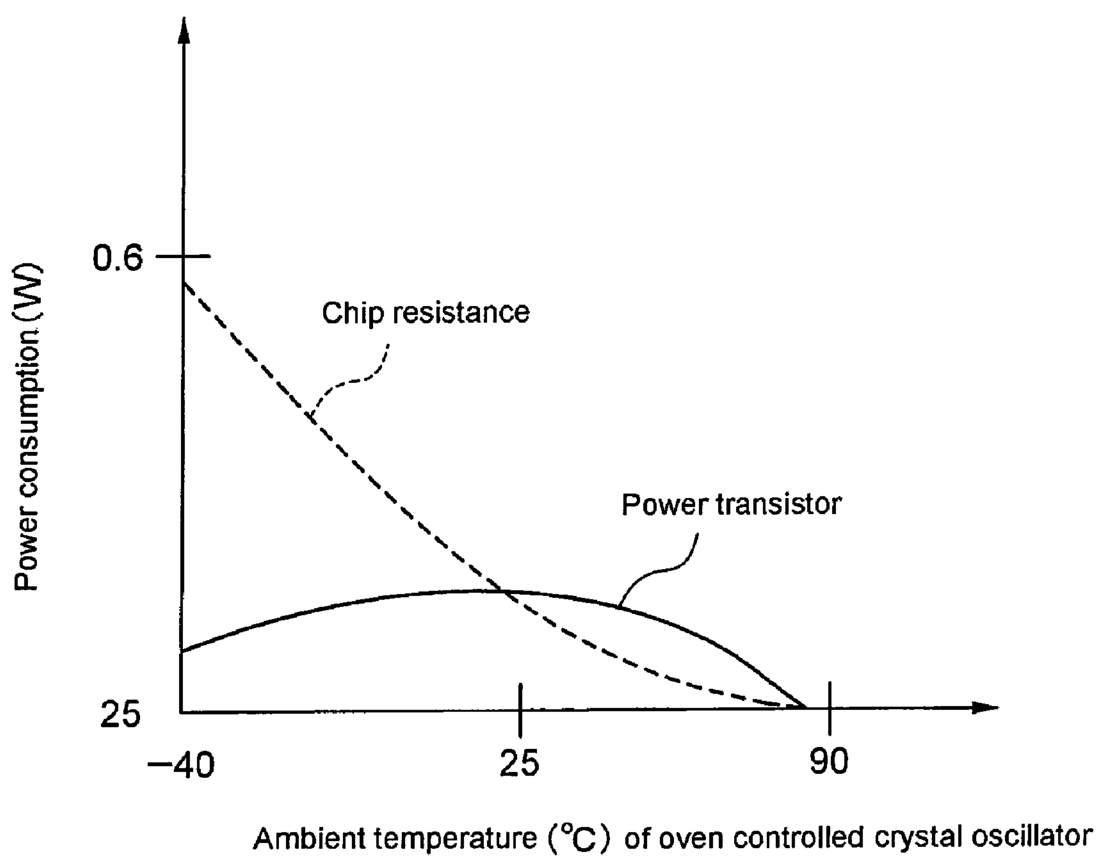
FIG. 5 is a diagram representing chip resistance, and power consumption characteristics of a power transistor.

FIG. 3 is a plan view of a circuit board for explaining a third embodiment of the present invention. Parts the same as in the above embodiments are denoted by the same reference symbols, and explanation thereof is simplified or omitted.

The different point between the oven controlled crystal oscillator 1 of this embodiment and the oven controlled crystal oscillator 1 of the first embodiment is the arrangement of open areas 12*a* to 12*d*. That is, in the oven controlled crystal oscillator 1 of the third embodiment, the open areas 12*a* to 12*d* are formed at positions on the inside from the four side faces of the heat-conducting plate 6, and the internal side faces of the open areas 12*a* to 12*d* are blocked. That is, a substantially rectangular penetrating groove is formed parallel to the four side faces of the heat-conducting plate 6. Moreover, a power transistor 10*a* and a heating resistance 9 are respectively arranged one each in the open areas 12*a* to 12*d*.

By such a configuration, the majority of the amount of heat discharged by the power transistor 10*a* and the heating resistance 9 arranged in the open areas 12*a* to 12*d* is transmitted to the heat-conducting plate, thereby enabling efficient heating of the crystal resonator 5.

In the above-described embodiments of the present invention, slits 15 are formed in the circuit board 2. However, when a required area cannot be ensured in the circuit board 2 due to downsizing of the circuit board 2, the slits 15 need not be formed. Furthermore, in the above-described embodiments, a crystal resonator 5 housing an SC-cut piece of crystal is used. However, a crystal resonator 5 housing an AT-cut piece of crystal can be used.

What is claimed is:

1. An oven controlled crystal oscillator comprising:

a heat-conducting plate mounted on a principal surface of a circuit board;

a crystal resonator mounted on a surface of said heat-conducting plate opposite to said surface of the circuit board;

an oscillation element constituting an oscillation circuit together with said crystal resonator, and a temperature sensor that detects temperature of said crystal resonator, mounted on said circuit board;

a heating resistance mounted on said circuit board, which heats said crystal resonator depending on a temperature detected by said temperature sensor; and a temperature control element including at least a power transistor, mounted on said circuit board to constitute a temperature control circuit together with said temperature sensor and said heating resistance, wherein two or more open areas communicating with said heat-conducting plate at least in the thickness direction thereof are formed on the periphery of said heat-conducting plate at positions mutually symmetric with respect to a center of said crystal resonator, wherein each open area has arranged a said power transistor and a said heating resistance.

2. An oven controlled crystal oscillator according to claim 1, wherein said open areas are formed opened to side faces of said heat-conducting plate.

3. An oven controlled crystal oscillator according to claim 2, wherein said heat-conducting plate has a rectangular shape as seen in a plan view, and said open areas are formed in the center of four side faces in said heat-conducting plate.

4. An oven controlled crystal oscillator according to claim 2, wherein said heat-conducting plate has a rectangular shape as seen in a plan view, and said open areas are formed at four corners of said heat-conducting plate.

5. An oven controlled crystal oscillator according to claim 1, wherein inner side faces of said open areas are blocked.

6. An oven controlled crystal oscillator according to either one of claim 3 and claim 5, wherein said heat-conducting plate is screw attached to said circuit board at four corners thereof.

7. An oven controlled crystal oscillator according to either one of claim 4 and claim 5, wherein said heat-conducting plate is screw attached to said circuit board at the center of four sides.

8. An oven controlled crystal oscillator comprising:

a heat-conducting plate mounted on a principal surface of a circuit board;

a crystal resonator mounted on a surface of said heat-conducting plate opposite to said surface of the circuit board;

an oscillation element constituting an oscillation circuit together with said crystal resonator, and a temperature sensor that detects temperature of said crystal resonator, mounted on said circuit board;

a heating resistance mounted on said circuit board, which heats said crystal resonator depending on a temperature detected by said temperature sensor; and a temperature control element including at least a power transistor, mounted on said circuit board to constitute a temperature control circuit together with said temperature sensor and said heating resistance, wherein two or more open areas communicating with said heat-conducting plate at least in the thickness direction thereof are formed on the periphery of said heat-conducting plate at positions mutually symmetric with respect to a center of said crystal resonator, wherein each open area has arranged a said power transistor and a said heating resistance, and wherein said heat-conducting plate has a rectangular shape as seen in a plan view, and said open areas are formed at four corners of said heat-conducting plate.

9. An oven controlled crystal oscillator according to claim 7, wherein said open areas are formed opened to side faces of said heat-conducting plate.

10. An oven controlled crystal oscillator according to claim 9, wherein said heat-conducting plate has a rectangular shape as seen in a plan view, and said open areas are formed in the center of four side faces in said heat-conducting plate.

11. An oven controlled crystal oscillator according to claim 8, wherein inner side faces of said open areas are blocked.

12. An oven controlled crystal oscillator according to claim 10, wherein said heat-conducting plate is screw attached to said circuit board at the four corners thereof.

13. An oven controlled crystal oscillator according to claim 8, wherein said heat-conducting plate is screw attached to said circuit board at the center of four sides.

* * * * *